(12) United States Patent
Hsu (10) Patent No.: US 7,342,824 B2
(45) Date of Patent: Mar. 11, 2008

(54) METHOD OF PROGRAMMING A 3D RRAM

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 328 days.

(21) Appl. No.: 11/249,881

(22) Filed: Oct. 12, 2005

(65) Prior Publication Data
US 2006/0033182 A1 Feb. 16, 2006

Related U.S. Application Data

(62) Division of application No. 10/720,890, filed on Nov. 24, 2003, now Pat. No. 7,009,278.

(51) Int. Cl.
*G11C 11/00* (2006.01)

(52) U.S. Cl. .................. 365/158; 365/148

(58) Field of Classification Search .......... 365/148, 365/158, 171; 257/296, 536
See application file for complete search history.

(56) References Cited

U.S. PATENT DOCUMENTS 6,134,138 A * 10/2000 Lu et al. ............ 365/158
6,998,698 B2 * 2/2006 Inoue et al. .......... 257/539

* cited by examiner

*Primary Examiner*—Gene N. Auduong
(74) *Attorney, Agent, or Firm*—Robert Varitz; Sharp Laboratories of America, Inc.

(57) ABSTRACT

A memory array layer for use in a 3D RRAM is formed, with peripheral circuitry, on a silicon substrate; layers of silicon oxide, bottom electrode material, silicon oxide, resistor material, silicon oxide, silicon nitride, silicon oxide, top electrode and covering oxide are deposited and formed. Multiple memory array layers may be formed on top of one another. The RRAM of the invention may be programmed in a single step or a two step programming process.

4 Claims, 7 Drawing Sheets

(WRITE 100ns; ERASE 2.5V, 100us)

METHOD OF PROGRAMMING A 3D RRAM

RELATED APPLICATION

This Application is a Divisional Application of a patent Application entitled 3D RAM, of Sheng Teng Hsu, Ser. No. 10/720,890, filed Nov. 24, 2003, now U.S. Patent No. 7,009,278, granted Mar. 7,2006.

FIELD OF THE INVENTION

This invention relates to thin film resistance memory device for non-volatile memory array application, and specifically to a resistance memory device which does not require an active device.

BACKGROUND OF THE INVENTION

The state of the art resistor memory device arrays requires an active device on a non-volatile memory element. In the case of a resistor memory device, such devices are either a one-resistor, one-transistor array, or a one-resistor, one-diode array, however, these arrays are not suitable for use in three-dimensional arrays for ultra high-density memory integration. The invention disclosed herein resolves this problem, as the memory cell of the invention may be incorporated into a large memory array, and does not require an active device. cl Summary of the Invention A memory array layer for use in a 3D RRAM, formed on a silicon substrate having peripheral circuitry thereon, includes a first layer of silicon oxide, deposited and planarized; a bottom electrode formed of a material taken from the group of materials consisting of Pt, $PtRhO_x$, $PtIrO_x$ and TiN/Pt; a second oxide layer having a thickness of at least 1.5X that of the thickness of the bottom electrode, deposited and planarized to a level where at the bottom electrode is exposed; a layer of memory resistor material; a layer of $Si_3N_4$; a third oxide layer having a thickness of about 1.5X of that of the memory resistor material; CMPd to expose the memory resistor surface; a top electrode formed of a material taken from the group of materials consisting of Pt, $PtRhO$ $PtIrO_x$ and TiN/Pt; and a covering oxide layer. Multiple memory array layers may be formed on top of one another.

A method of programming a 3D RRAM in a single step includes selecting a memory cell to be written to; applying a high voltage programming pulse to a first related bit line; applying a low voltage programming pulse to a second related bit line; floating the associated word line; biasing all other word lines with half-programming pulse voltages; and biasing all non-selected bit lines to the ground potential.

A method of programming a 3D RRAM in a two-step operation includes selecting a memory cell to be written to; applying a low voltage programming pulse to a first memory resistor in the memory cell; applying a high voltage programming pulse to a second memory resistor in the memory cell; setting the selected word line to ground potential; biasing all other word lines are biased to $0.5 V_P$; biasing a first related bit line with a negative programming pulse, having a pulse amplitude of $-V_P$; biasing a second related bit line with a positive programming pulse, having amplitude of $+V_P$; and pulsing all non-selected memory resistors with a programming voltage of between $0V_P$ and $0.5 V_P$.

The memory cell of the invention may be read by applying a small voltage to the word lines of the non-selected bits to enhance the line voltage difference between the first related bit line and the second related bit line; and applying a read voltage to the word line associated with the selected memory cell and detecting the voltage difference between the first related bit line and the second related bit line.

It is an object of the invention to provide a reliable resistive non-volatile suitable for three-dimensional structure ultra high-density memory array which does not require an active device.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

As previously noted, state-of-the-art resistive memory arrays require active devices, such as a diode or a transistor, to prevent interaction among the memory cells of the array. Thus, for a three-dimensional array, a polycrystalline diode, or transistor, is required for each cell, which is generally located above the first layer in the memory array. Polycrystalline diodes and polycrystalline transistors exhibit high leakage current, and therefore are not suitable for incorporation into large arrays. The polycrystalline layer may be crystallized to improve active device performance and reduce leakage current, however, the high temperature process required for crystallization may destroy the memory elements which are located under the polycrystalline layer. This invention solves this problem by providing a resistor memory cell which does not have an active device.

Figure 1:
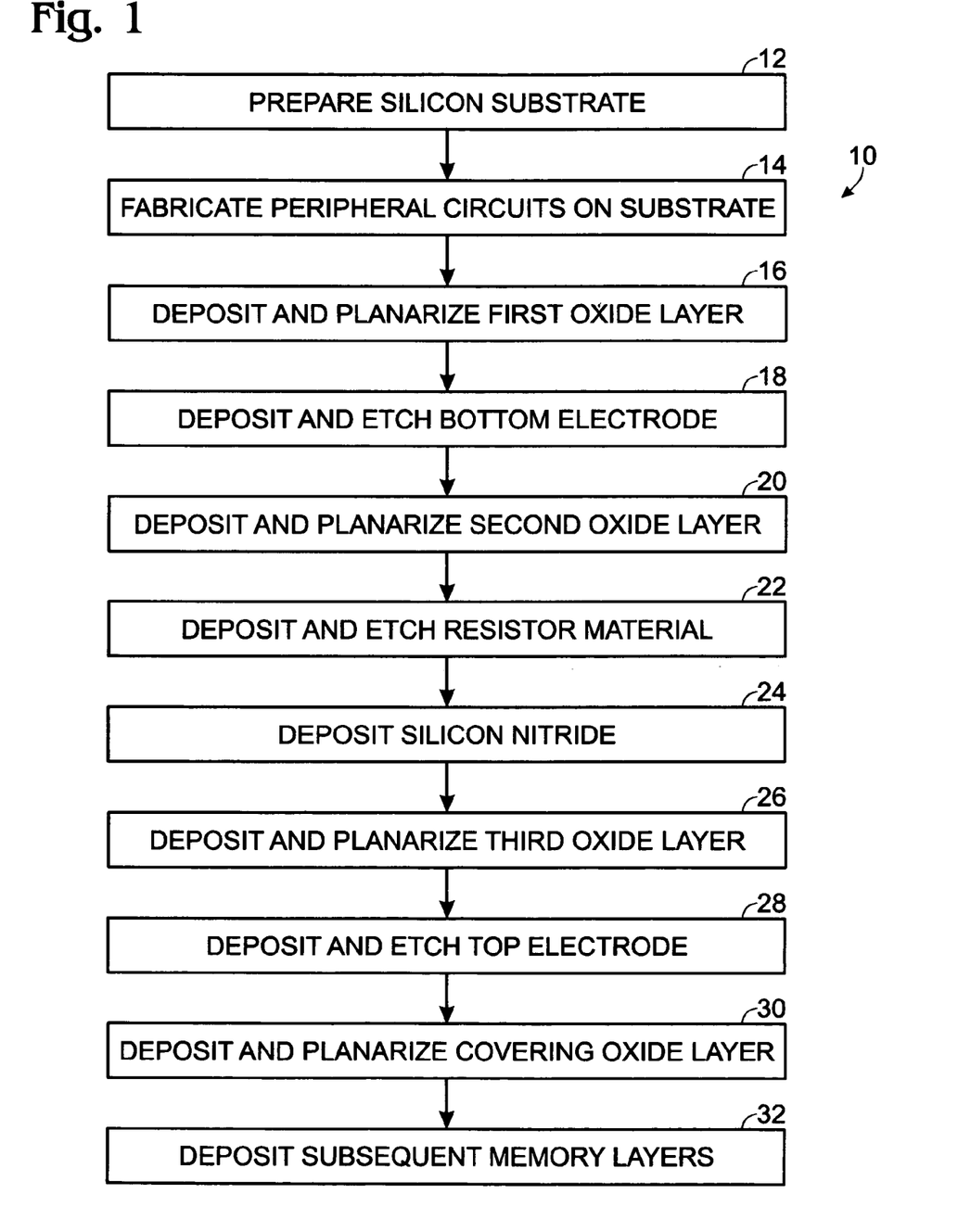
FIG. 1 is a block diagram of the method of the invention.

Referring now to FIG. 1, steps for fabricating the device of the invention, as shown in FIG. 1, generally at 10, include, initially, following any state-of-the-art processes to prepare a silicon substrate, 12, and fabrication of peripheral circuits, 14, on the silicon substrate. A first layer of silicon oxide, having a thickness of between about 100 nm to 1000 nm, is deposited and planarized, 16, by a chemical-mechanical polishing (CMP) process. A bottom electrode having a thickness of between about 50 nm to 300 nm of Pt, or a thickness of between about 10 nm to 200 nm of TiN and between about 10 nm to 100 nm of Pt, in a bi-layer electrode, is deposited and etched, 18. Materials for the bottom electrode may include Pt, PtRhO$_x$ PtIrO$_x$ and TiN/Pt. A second oxide layer having a thickness of at least 1.5× that of the thickness of the bottom electrode is deposited and planarized, 20, to a level where at the bottom electrode is exposed. Memory resistor material, such as a colossal magneto resistive (CMR) material, or other suitable memory resistor material, having a thickness of between about 20 nm to 150 nm, is deposited and etched, 22. A thin layer of Si$_3$N$_4$, e.g., having a thickness of between about 10 nm to 30 nm, is deposited, 24. An optional step of forming a sidewall at this phase of fabrication includes masking and etching to form a Si$_3$N$_4$ sidewall on the memory resistors. Regardless of whether or not a sidewall is formed, the next step is deposition, 26, of a third oxide layer having a thickness of about 1.5× of that of the memory resistor material. The structure is CMPd to expose the memory resistor surface. A top electrode of Pt, having a thickness of between about 50 nm to 300 nm, or a bi-metal top electrode of Pt, having a thickness of between about 10 nm to 100 nm and TiN having a thickness of between about 10 nm to 200 nm, is deposited and etched, 28. Materials for the top electrode may include Pt, PtRhO$_x$ PtIrO$_x$ and TiN/Pt. Additional oxide, having a thickness of between about 100 nm to 1000 nm, is deposited and planarized, 30, followed by the deposition of a bottom electrode of the second layer memory array. The process is then repeated, 32, to complete the second and subsequent layers of the memory array. In theory there is no limitation of the number of memory arrays can be fabricated onto the silicon surface. The limitation is the area for the sensing amplifiers and the periphery circuits on the surface of the silicon wafer.

Figure 2:
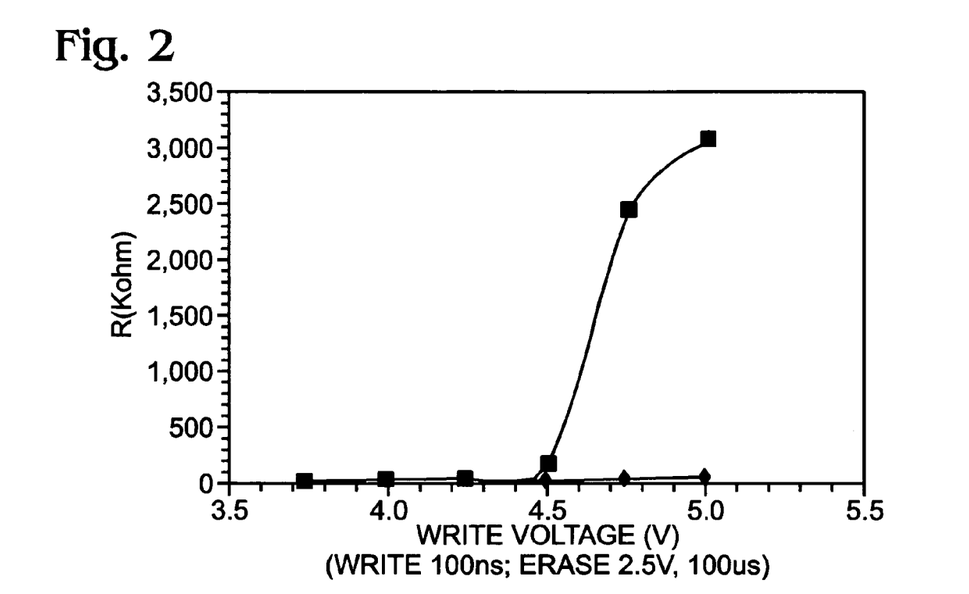
FIG. 2 depicts conditions for programming a CMR memory resistor to a high resistance state.
Figure 3:
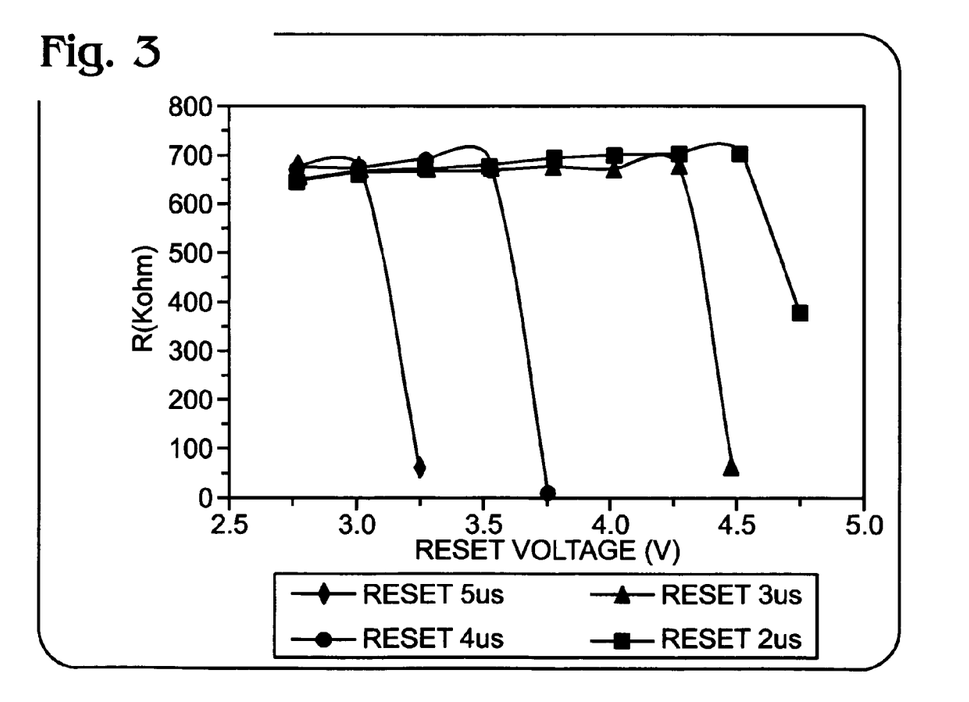
FIG. 3 depicts conditions for programming a CMR memory resistor to a low resistance state.

There is a clear threshold voltage for programming a CMR memory resistor such as shown in FIGS. 2 and 3. FIG. 2 depicts the conditions for programming a CMR memory resistor of the invention to a high resistance state. The resistance of the resistor does not change when the applied pulse amplitude is less than 4.5V. When the amplitude of the applied pulse is larger than 4.5V, the resistance of the resistor increases with increasing pulse amplitude. FIG. 3 depicts the conditions for programming the resistance of the resistor to low resistance state. Again, there is clear threshold pulse amplitude for each pulse width. Both the high resistance state and the low resistance state threshold pulse amplitudes decrease with decreasing CMR film thickness. It is therefore possible to select a programming pulse amplitude such that, at one-half of the programming pulse, there is no change in memory resistor resistance, regardless of whether the resistor is at the high resistance state or at the low resistance state.

Figure 4:
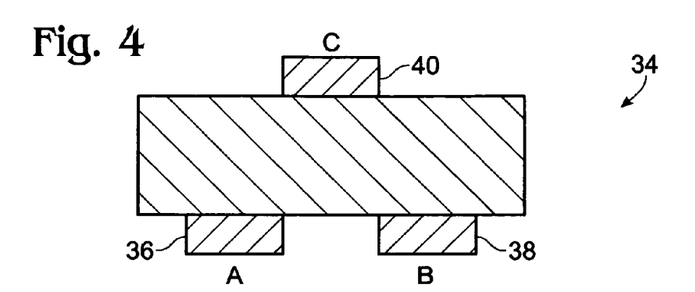
FIG. 4 depicts a three terminal memory cell of the invention.
Figure 5:
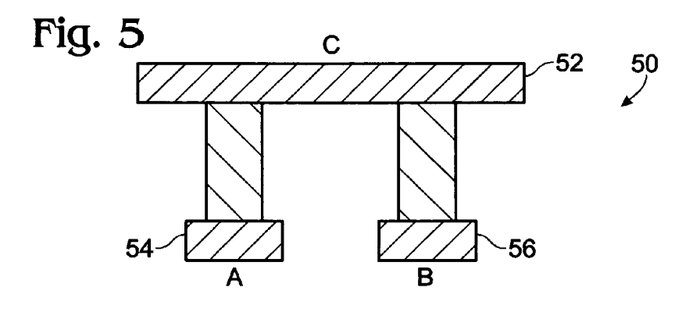
FIG. 5 depicts a two terminal memory cell of the invention.

For a three terminal memory cell, as shown in FIG. 4, generally at 34, having two electrodes at the bottom, 36, 38, and one electrode, 40, at the top, the application of a programming pulse between the two bottom electrodes, with top electrode floated, e.g., open, the resistance between the top electrode and the cathode increases to a high resistance state, while that between the top electrode and the anode decreases to low resistance-state, where A is the cathode, B is the anode, and C is the ground; and where R(AC)=R$_H$, and R(BC)=R$_L$. The threshold programming amplitude and the three-terminal memory resistor provide the basic structure for the active deviceless memory cell of the invention. Sensing, programming, and other supporting circuits, are fabricated on the silicon substrate. In the case of a two-terminal memory cell, FIG. 5 depicts such a cell generally at 50, wherein ground C, 52, overlays both the anode A, 54, and the cathode B, 56

Figure 6:
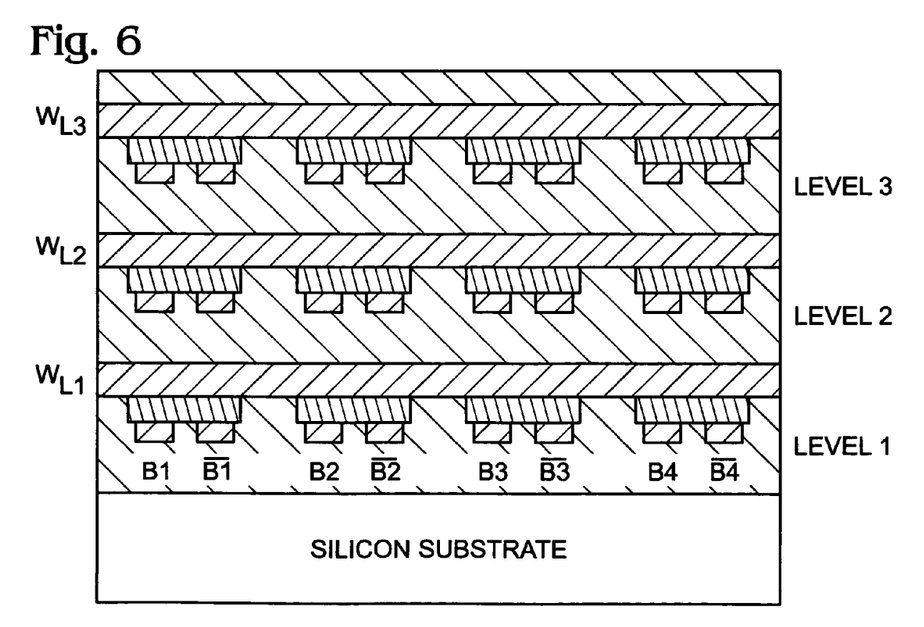
FIG. 6 is a cross-section of a memory array taken along word lines.
Figure 7:
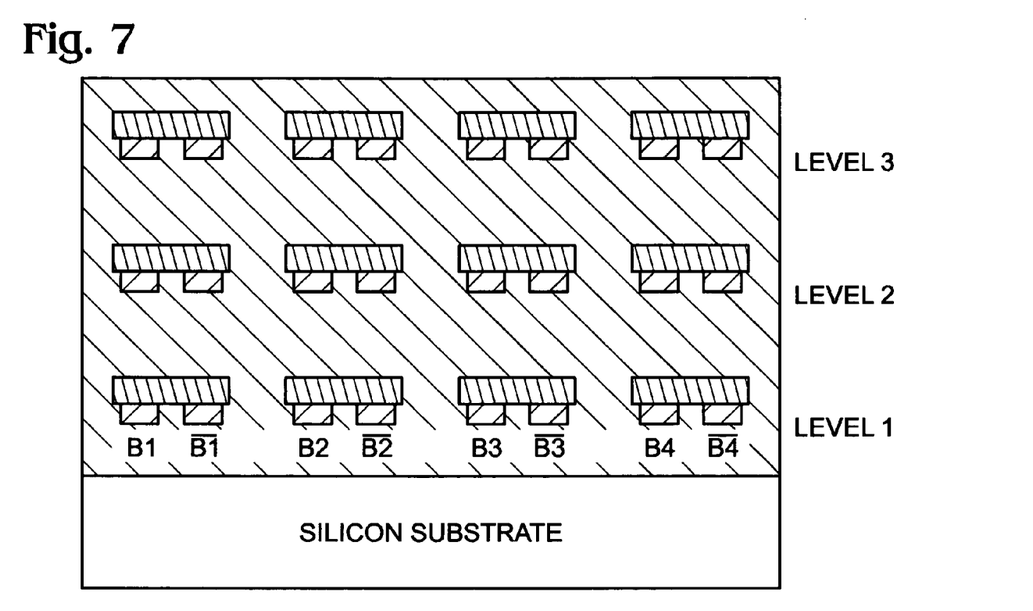
FIG. 7 is a cross-section of a memory array taken between word lines.
Figure 8:
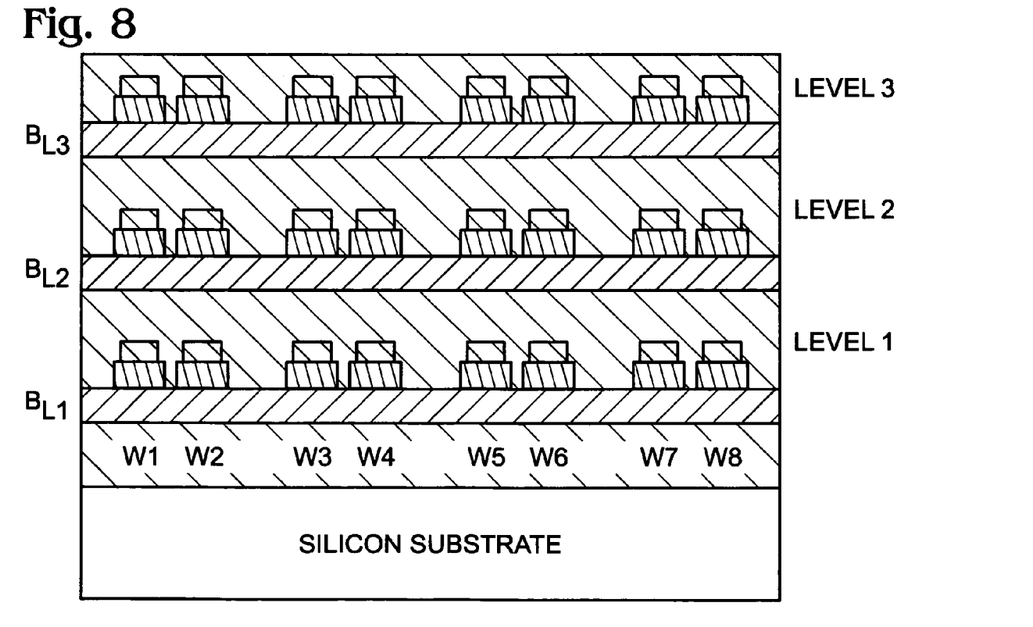
FIG. 8 is a cross-section of a memory array taken along bit lines.

FIGS. 6-8 depict the three-dimensional memory array of the invention, taken in cross-section along and between word lines and along bit lines, respectively. Although the depicted array has only three, vertically stacked layers, any number of layers may be incorporated into a memory array constructed according to the invention. The CMR resistor is isolated with oxide. An oxygen diffusion barrier, e.g., Si$_3$N$_4$, Al$_2$O$_3$, TiO$_2$, etc., may be required in some instances. Only the array is the subject of the invention, and as such, the details of the physical cell structure are not discussed herein.

Figure 9:
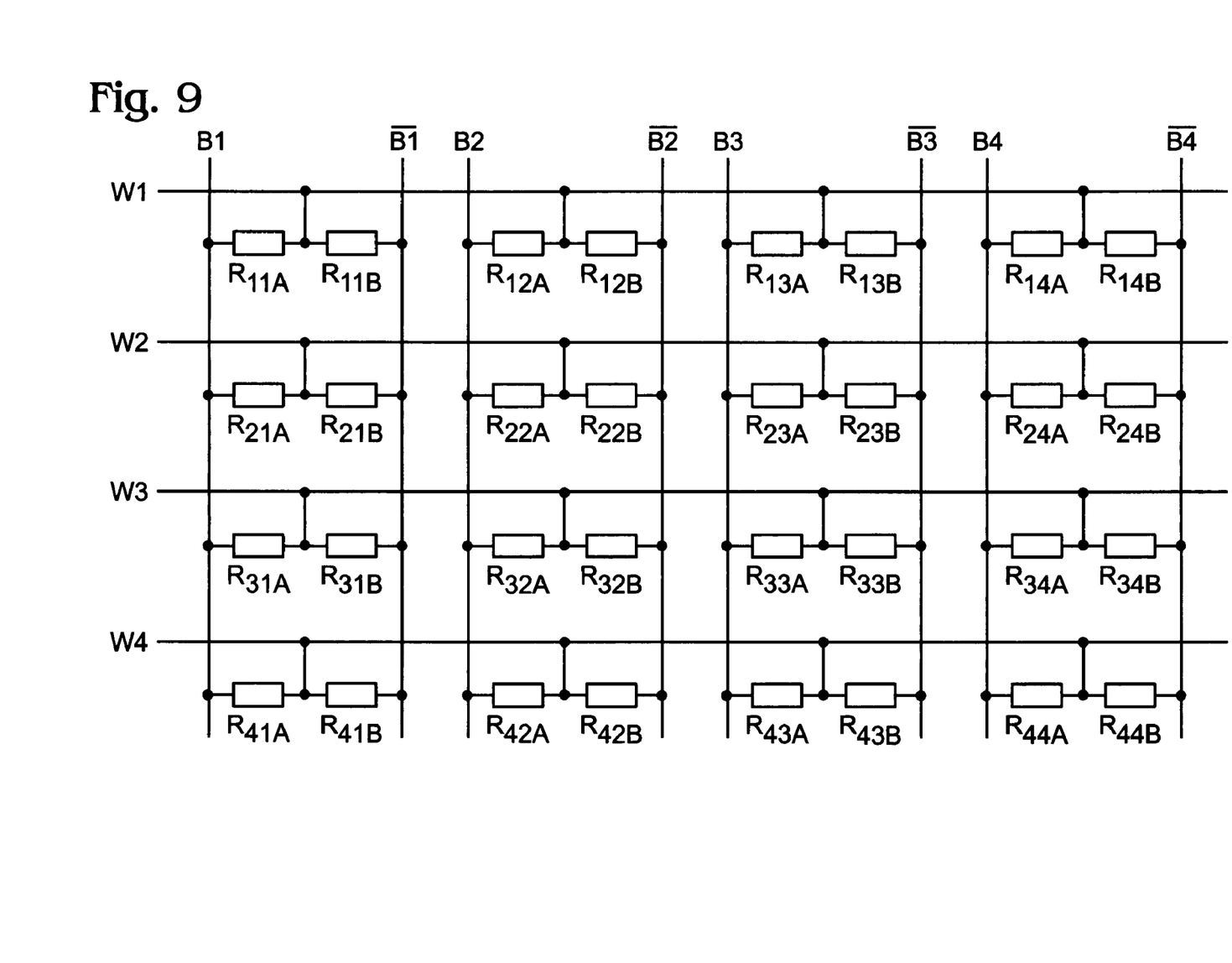
FIG. 9 is a schematic of a single level of the 3D memory array of FIGS. 6-8.

FIG. 9 depicts an equivalent circuit for a given single level memory array. It is a complementary output memory cell array. Each memory cell consists of two memory resistors. Each of the complementary bit lines is connected to the respect input of a differential amplifier, which was not shown in this figure. The output of the differential amplifier may be connected to an inverter for a digital output at either "0" or "1" state.

There are two methods to program the memory of this array, which are described with reference to FIG. 9. A one-step programming method for a three terminal memory cell and a two-step programming applicable for both three terminals and two terminal memory cells. The one-step programming requires that the RRAM thin film has uniform material property. The two-step programming may be applied to any non-uniform property RRAM thin film memory cell.

The one-step programming process will be discussed first. The selected cell is W2B2 and a first related bit line, B22, will be programmed to high voltage bit and a second related bit line, $\overline{B22}$, will be programmed to low voltage bit. The word line, W2 is floated. All other word lines are biased with half-programming pulse voltage. Bit line B22 is grounded. Programming pulse, V$_P$ is applied to $\overline{B22}$. All other bit lines are biased to the ground potential. As a result the resistor R22A is at the low resistance-state and the resistance B22B is at the high resistance-state. All memory resistor in the bit2 other than that connected to W2 word lines are biased with half of the programming voltage. Therefore, there is no resistance change. Similarly each bit lines along the W2 may be properly biased to program one word at a time. After programming, the two memory cell resistors in any given bit are at the high resistance-state and low resistance-state, respectively.

The two-step programming is more conventional. Again, cell W2B2 is selected in this example. A first selected memory resistor, R$_{22A}$ and memory resistor R$_{22B}$ are programmed to a low resistance state and to a high resistance-state, respectively. The selected word line, W2, is set to ground potential, and all other word lines are biased to 0.5 V$_P$. A negative programming pulse, having pulse amplitude of −V$_P$, and a positive programming pulse, having amplitude of +V$_P$, with appropriate pulse widths, are applied to bit lines B2 and $\overline{B2}$, respectively. The positive and the negative programming pulses do not have to be applied simultaneously, and the A resistor and the B resistor may be programmed separately. Memory resistors, R$_{22A}$ and R$_{22B}$, are, therefore, programmed to a low resistance state, R$_L$ and a high resistance state, R$_H$, respectively. All other memory resistors are either pulsed with half of the programming pulse voltage, or not pulsed. Therefore, the resistance of the non-selected memory resistors will not change during this programming operation.

The memory array may be read by applying a read voltage to the word line and detecting (reading) the voltage difference between the bit lines which share the memory cell. The read output voltage of a given memory bit is fairly complex because of the load resistance from the non-selected bits, however, a small voltage may be applied to the word line of the non-selected bits to enhance the bit line voltage difference. There are two extreme cases, which are depicted in FIGS. 9 and 10, and which allow the detection of the smallest differential output voltage between the bit lines of a given memory cell.

Figure 10:
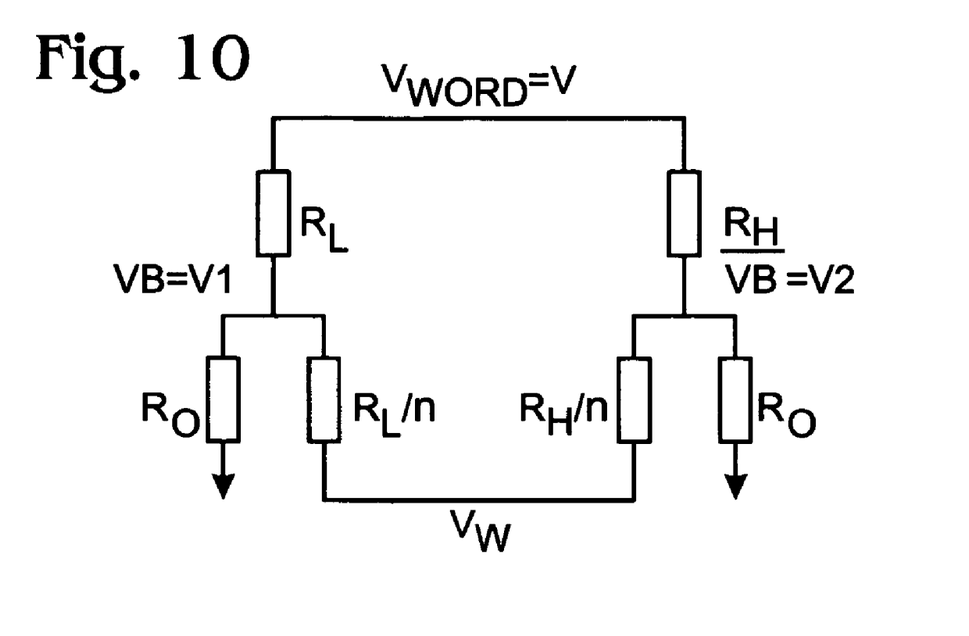
FIG. 10 is a schematic of a selected bit of the circuit of FIG. 9, depicting a first worst case read scenario.

The equivalent circuit of a selected bit is shown in FIG. 10, wherein all memory resistors connected to the bit line are programmed to low resistance state, while memory resistors not connected to the bit not line are all programmed to a high resistance state. Assume that the load resistance on the bit lines is $R_O$, in which case, the load resistance associated with the bit line for memory resistors programmed to $R_L$ is the smallest, and the load resistance associated with the $R_H$ memory resistors is the largest. Therefore, the bit line differential output voltage is also expected to be small without application of a non-selected word line bias. The bit line voltages are:

$$\frac{V1}{V} = 1 - \frac{\left(\frac{R_H}{n} + R_O - R_O \frac{V_W}{V}\right) R_L}{(R_L + R_O)\left(\frac{R_H}{n} + R_O\right) - R_O^2} \quad (1)$$

and $$\frac{V1}{V} = 1 - \frac{\left(\frac{R_L}{n} + R_O - R_O \frac{V_W}{V}\right) R_H}{(R_H + R_O)\left(\frac{R_L}{n} + R_O\right) - R_O^2} \quad (2)$$

Figure 11:
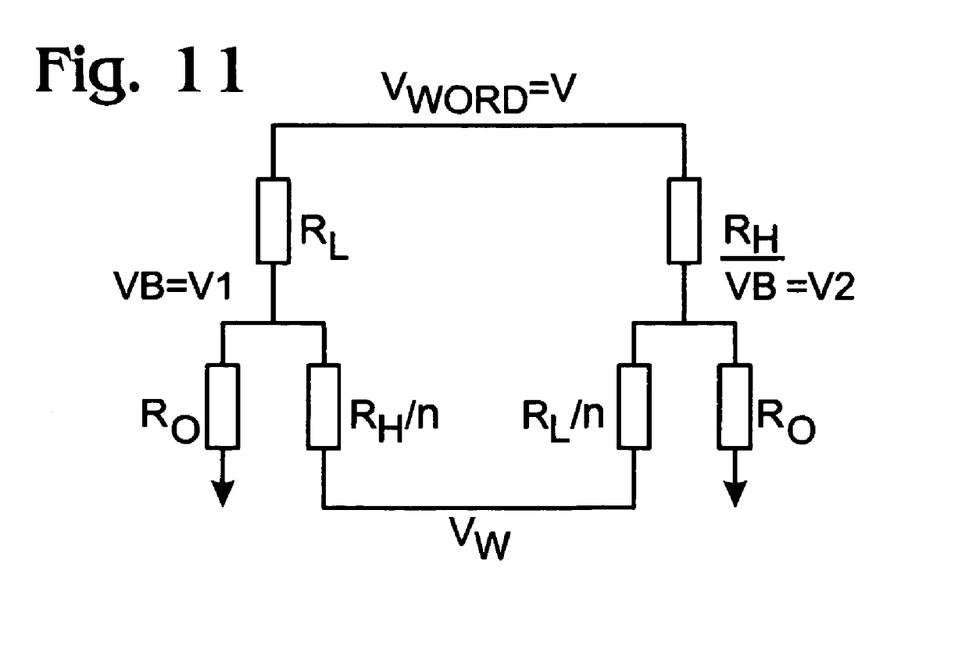
FIG. 11 is a schematic of a selected bit of the circuit of FIG. 9, depicting a second worst case read scenario.

Referring now to FIG. 11, the second case occurs when the selected memory cell at the given bit line is programmed at low resistance state, $R_L$, and all non-selected memory cells connected to the same bit line are programmed to $R_H$. The equivalent circuit is shown in FIG. 11. The load resistor associated with the $R_L$ memory resistor is the largest, while the load resistor associated with the $R_H$ memory resistor is the smallest. Therefore, the differential voltage between the bit lines is largest without application of the non-selected word line bias.

$$\frac{V1}{V} = 1 - \frac{\left(\frac{R_L}{n} + R_O - R_O \frac{V_W}{V}\right) R_L}{(R_L + R_O)\left(\frac{R_L}{n} + R_O\right) - R_O^2} \quad (3)$$

and $$\frac{V2}{V} = 1 - \frac{\left(\frac{R_H}{n} + R_O - R_O \frac{V_W}{V}\right) R_H}{(R_H + R_O)\left(\frac{R_H}{n} + R_O\right) - R_O^2} \quad (4)$$

Figure 12:
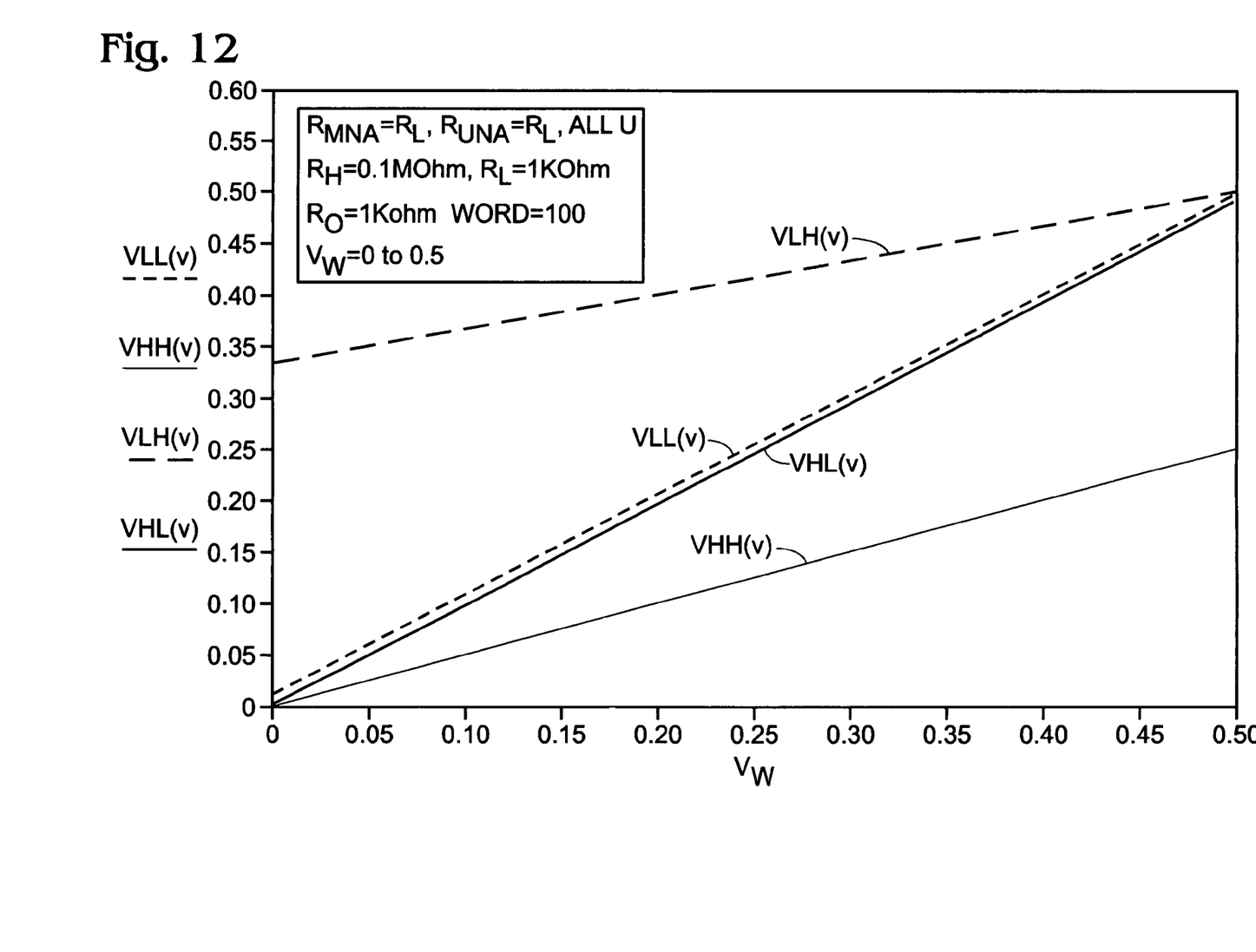
FIG. 12 is a graph depicting the worst case read scenarios.

FIG. 12 depicts plots of the normalized bit lines voltages as a function of non-selected word line bias voltage for memory arrays with 100 word lines connected to a given bit line. The high resistance state is 100 K Ohm and the low resistance state is 1 K Ohm. The data shows that the differential voltage between bit lines, where the voltage differential between VLL(V) and VHH(V) and that between VLH(V) and VHL(V) are the differential output voltages of the equivalent circuits of FIGS. 10 and 11, respectively. The differential output voltages increase with increasing $R_H/R_L$ ratio.

Thus, a 3D RRAM has been disclosed. It will be appreciated that further variations and modifications thereof may be made within the scope of the invention as defined in the appended claims.

I claim:

1. A method of programming a 3D RRAM comprising:
   selecting a memory cell to be written to;
   applying a high voltage programming pulse to a first related bit line;
   applying a low voltage programming pulse to a second related bit line;
   floating the associated word line;
   Biasing all other word lines with half-programming pulse voltages; and
   biasing all non-selected bit lines to the ground potential.

2. The method of claim 1 wherein reading a memory cell includes
   applying a small voltage to the word lines of the non-selected bits to enhance the line voltage difference between the first related bit line and the second related bit line; and
   applying a read voltage to the word line associated with the selected memory cell and detecting the voltage difference between the first related bit line and the second related bit line.

3. The method of claim 1 wherein reading a memory cell includes
   applying a small voltage to the non-selected word lines to enhance the line voltage difference between the first related bit line and the second related bit line; and
   applying a read voltage to the word line associated with the selected memory cell and detecting the voltage difference between the first related bit line and the second related bit line.

4. A method of programming a 3D RRAM comprising:
   selecting a memory cell to be written to;
   applying a low voltage programming pulse to a first memory resistor in the memory cell;
   applying a high voltage programming pulse to a second memory resistor in the memory cell;
   setting the selected word line to ground potential;
   biasing all other word lines are biased to 0.5 $V_P$;
   biasing a first related bit line with a negative programming pulse, having a pulse amplitude of $-V_P$;
   biasing a second related bit line with a positive programming pulse, having amplitude of $+V_P$; and
   pulsing all non-selected memory resistors with a programming voltage of between $0V_P$ and 0.5 $V_P$.

* * * * *